United States Patent [19]

Matsumoto et al.

[11] Patent Number: 4,930,105

[45] Date of Patent: May 29, 1990

[54] NONVOLATILE SEMICONDUCTOR MEMORY DEVICE WITH A DOUBLE GATE STRUCTURE

[75] Inventors: Osamu Matsumoto; Tadashi Maruyama; Hiroyoshi Murata, all of Yokohama; Isao Abe, Kawasaki; Tomohisa Shigematsu, Yokohama; Kazuyoshi Shinada, Yokohama; Yasoji Suzuki, Yokohama; Ichiro Kobayashi, Yokohama, all of Japan

[73] Assignee: Kabushiki Kaisha Toshiba, Kawasaki, Japan

[21] Appl. No.: 178,609

[22] Filed: Apr. 7, 1988

[30] Foreign Application Priority Data

Apr. 9, 1987 [JP] Japan ................................ 62-87482

[51] Int. Cl.$^5$ .................... G11C 7/00; G11C 11/40; H01L 29/78
[52] U.S. Cl. .................... 365/185; 365/182; 365/184; 357/23.5
[58] Field of Search ............... 365/182, 185, 168, 149, 365/218, 184, 183; 357/23.5, 23.3

[56] References Cited

U.S. PATENT DOCUMENTS

| | | | |
|---|---|---|---|
| 4,448,400 | 5/1984 | Harrari | 357/235 |
| 4,467,453 | 8/1984 | Chiu et al. | 365/185 |
| 4,652,897 | 3/1987 | Okuyama et al. | 365/168 |
| 4,725,980 | 2/1988 | Wakimoto et al. | 365/185 |
| 4,754,320 | 6/1988 | Mizutani et al. | 365/185 |
| 4,788,663 | 11/1988 | Tanaka et al. | 365/185 X |
| 4,794,565 | 12/1988 | Wu et al. | 365/185 X |
| 4,812,898 | 3/1989 | Sumihiro | 365/218 |
| 4,870,615 | 9/1989 | Marayama | 365/185 |

FOREIGN PATENT DOCUMENTS 0143596 6/1985 European Pat. Off. .
0183235 6/1986 European Pat. Off. .

Primary Examiner—Stuart N. Hecker
Assistant Examiner—Alfonso Garcia
Attorney, Agent, or Firm—Finnegan, Henderson, Farabow, Garrett and Dunner

[57] ABSTRACT

A memory cell of a nonvolatile semiconductor memory device includes a P conductive type semiconductor substrate, first and second diffusion layers of an N conductivity type, formed in the substrate, a channel region formed in the surface region of the substrate, and which is located between the first and second diffusion layers, a floating gate electrode formed on the channel region, and a control gate electrode formed on the floating gate electrode. The memory cell further includes a third diffusion layer of the N conductivity type, and formed between the first layer and the channel region, the third layer having an impurity concentration lower than that of the first layer.

16 Claims, 8 Drawing Sheets

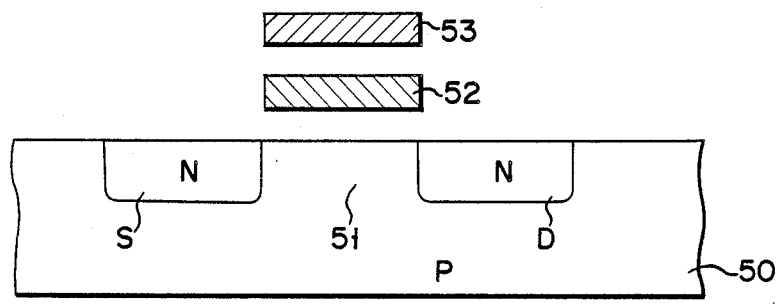
FIG. 1 (PRIOR ART)
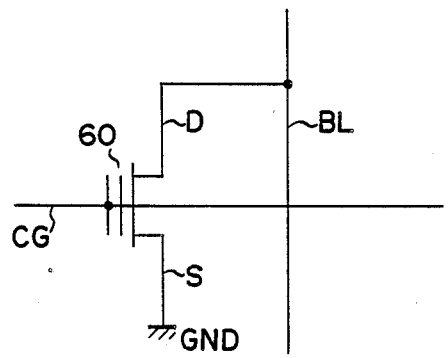
FIG. 2 (PRIOR ART)
| MODE | WRITE | ERASE | READ |
|---|---|---|---|
| BL | 12.5V | — | 2V |
| CG | 12.5V | — | 5V |
| S | 0V | — | 0V |
FIG. 3 (PRIOR ART)

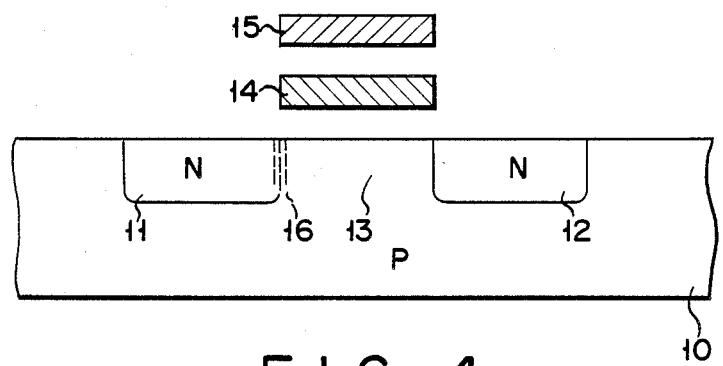
FIG. 4
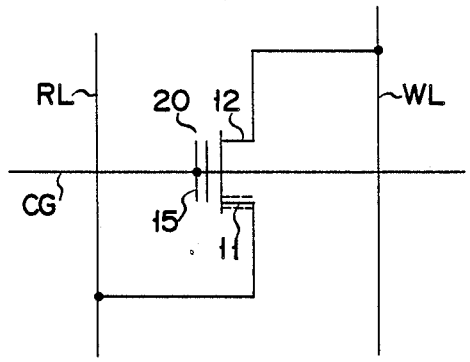
FIG. 5
| MODE | WRITE | ERASE | READ |
|------|-------|-------|------|
| WL | 12.5V | — | 0V |
| CG | 12.5V | — | 5V |
| RL | 0V | — | 5V |
FIG. 6

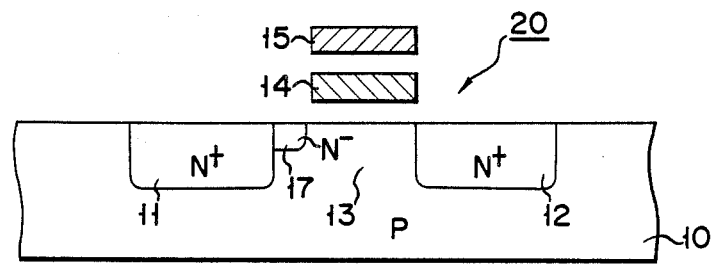
F I G. 7
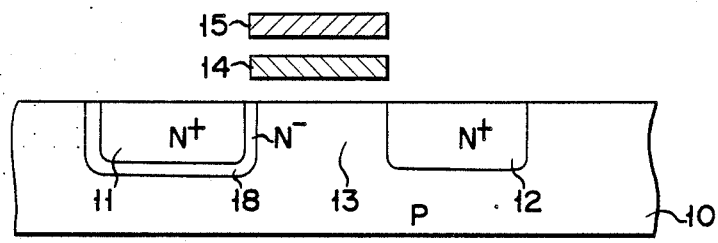
F I G. 8
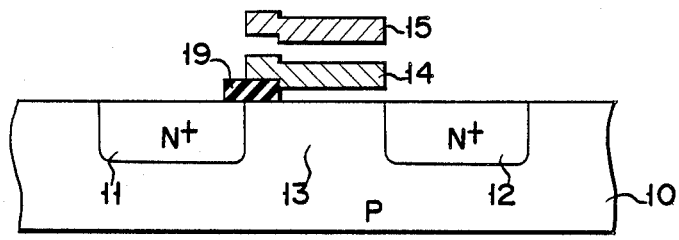
F I G. 9

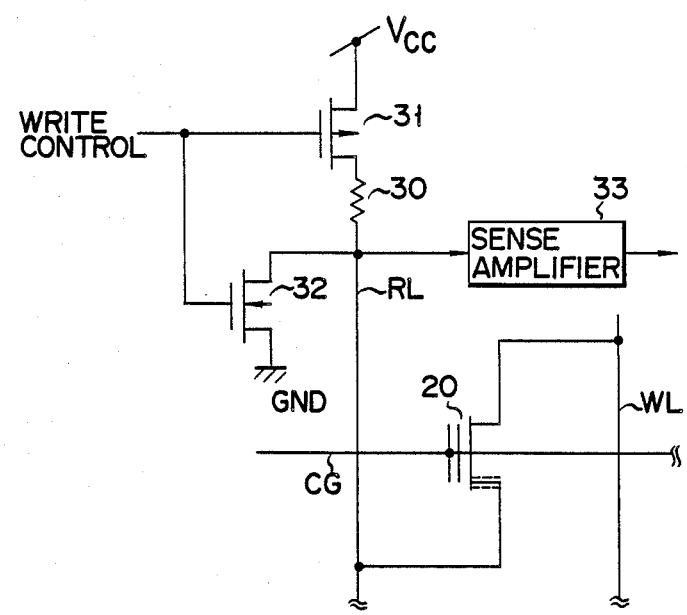
F I G. 12
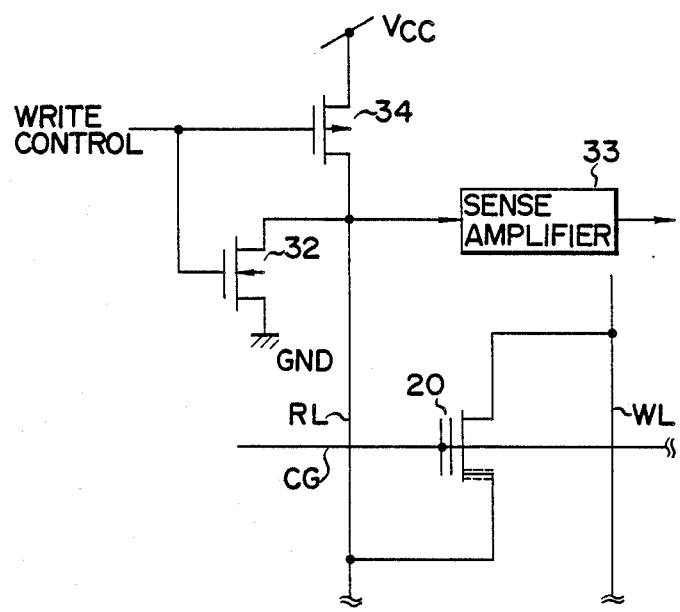
F I G. 13

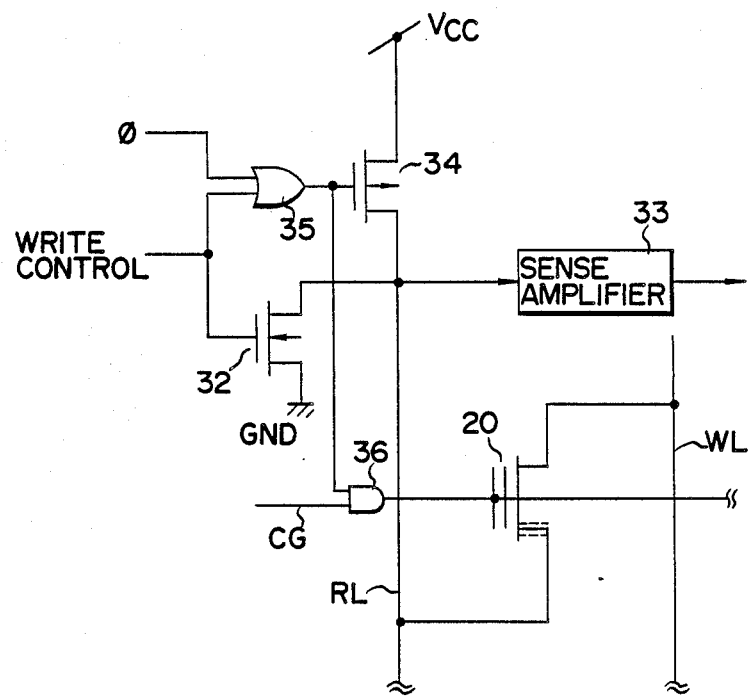
F I G. 16
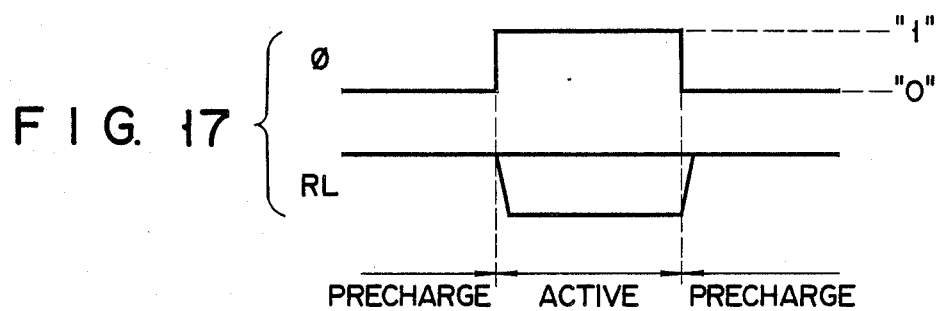
F I G. 17

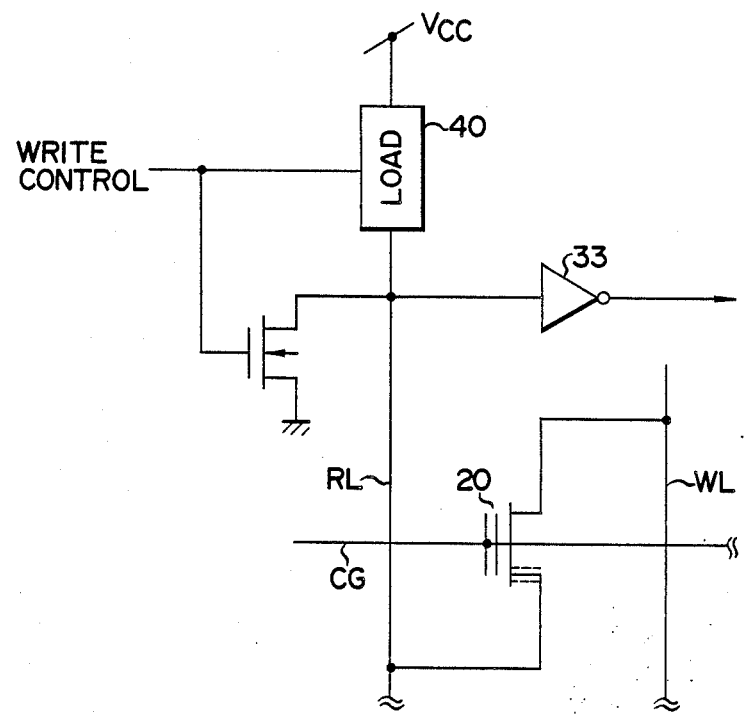
F I G. 18

NONVOLATILE SEMICONDUCTOR MEMORY DEVICE WITH A DOUBLE GATE STRUCTURE

BACKGROUND OF THE INVENTION

1. Field of the Invention

This invention relates to nonvolatile semiconductor memory devices made up of nonvolatile transistors and allowing the stored data to be replaced by other data.

2. Description of the Related Art

This type of nonvolatile semiconductor memory device is well known as an EPROM (erasable and programmable read only memory). One of the known memory cells, which are used for the EPROM, is a double layered type transistor. In this transistor, floating and control gate electrodes are layered in the channel region, which is located between the source and drain regions.

The prior memory cell based on the double gate type transistor is illustrated in cross-sectional form in FIG. 1. As shown, source region S and drain region D, as N type diffusion layers, are separately formed in the surface region of P type semiconductor substrate 50. Channel region 51 is located between source and drain regions S and D. A first gate insulating film (not shown) is formed on channel region 51. Floating gate electrode 52 made of polycrystalline silicon, for example, is further formed on the first gate insulating film. A second gate insulating film (not shown) is formed on floating gate electrode 52. Control gate electrode 53, which is made of polycrystalline silicon, is laid on the second gate insulating film.

The memory cell thus structured can be electrically depicted as an equivalent circuit, as shown in FIG. 2. A bit line BL is connected to the drain region D of transistor 60 used as a memory cell. The control gate electrode 53 is connected to control gate line CG. The source region S is connected to ground GND.

The memory cell thus arranged operates in three modes, write, erase, and read modes. These operation modes, and voltages at the source region S, bit line BL and control gate line CG, are tabulated as in FIG. 3. The integrated circuit containing the EPROM uses three power voltages, GND, Vcc and Vpp; GND=0V (ground), Vcc=5V, and Vpp=12.5V.

The write mode will first be described. This mode is called an electron injection mode. In this mode, electrons are injected into floating gate electrode 52 to raise the threshold voltage of cell transistor 60. The voltages at the respective portions in this mode are: BL=12.5, CG=12.5, and S=0V. In operation, an intensive electric field is concentrated in the depletion layer, which is formed particularly in the vicinity of the drain region D. Electrons travel from the source region S of transistor 60 toward drain region D. The electrons toward the drain region D are accelerated by the electric field concentrated near the drain region D, and gain enough energy to jump over the energy barrier of the first gate insulating film (not shown), from the surface of substrate 50. This type of electrons are called hot electrons. The hot electrons are attracted by the high voltage applied to the control gate electrode 53, and pass through the first gate insulating film, and enter into floating gate electrode 52, and are arrested there. As a result, the floating gate 52 is negatively charged, and in the region of the substrate under floating gate electrode 52, i.e., in the channel region 51, it is difficult for the inversion of conductivity or channel formation to occur. In other words, the threshold voltage of cell transistor 60 substantially rises.

The data erase mode is also called an electron emission mode. In this mode, the memory cells are radiated with ultraviolet rays. The radiated ultraviolet rays excite the electrons, which are injected into floating gate electrode 52 in the data write mode. The excited electrons jump over the energy barrier of the second insulating film (not shown) and enter into control gate electrode 53. The electrons also jump over the energy barrier of the first insulating film (not shown) to enter into substrate 50. Such flow of electrons reduces the threshold value of cell transistor 60.

In the data read mode, the respective voltages are: BL=2V, CG=5V, and S=0V. In this mode, when the electrons have been injected into floating gate 52, the threshold voltage of the cell transistor is large. Under this condition, no channel is formed between the source and drain regions, thereby prohibiting the flow of cell current. The bit line voltage is kept at 2V. When the electrons are being emitted from the electrode, the threshold voltage of cell transistor 60 is small. Therefore, a channel is formed between the source and drain regions, to allow the cell current to flow. Further, the bit line voltage drops to approximately 0V. In this way, when the data is read out, the bit line voltage change in accordance with whether or not electrons are injected into or emitted from floating gate electrode 52. The voltage change on the bit line is amplified by a sense amplifier (not shown). This provides logical "1" or "0" of the data as read out from cell transistor 60.

It is in the data read out mode that a memory cell problem arises in the prior art memory device. This is caused by the fact that the small 2V voltage is amplified by the sense amplifier. The sense amplifier must amplify this small voltage to such a level as to enable discrimination of logical "1" or "0". Therefore, the sense amplifier must have a high performance characteristic. This fact implies that the circuit design is difficult, the circuit is complicated, and the cost to manufacture is high.

The reason why the bit line voltage BL must be held at about 2V, and not a larger voltage such as 5V, in the read mode, will be described. When BL=5V, the voltage of drain region D is 5V. Under this condition, the electric field is concentrated in the vicinity of drain region D as in the data write mode, and is weaker in intensity than that of the electric field in the write mode. When the cell transistor in which no electrons are emitted, is subjected to the read mode for a long time, electrons are injected little by little into floating gate electrode 52, so that the threshold voltage of the cell transistor gradually rises. After a predetermined period of time elapses, enough electrons have been injected into floating gate electrode 52 to invert the logical level of the data stored in the cell transistor. As a result, erroneous data will be read out from the cell transistor. Such a phenomenon is called a soft write (weak write). The characteristic of the soft write phenomenon with respect to the time lapse is called a read retention characteristic (data hold characteristic).

The read retention characteristic is enhanced, by constraining the soft write phenomenon. A possible way to improve the read retention characteristic is to decrease the bit line voltage in the read mode. In this approach, however, a difference between the bit line potentials when the electrons are being injected into the cell transistor and when they are emitted from the transistor, is small, and narrows the logical margin in the read mode. It is for this reason that decreasing the bit line potential in the read mode is limited to about 2V, BL=2V. With BL=2V, the read retention characteristic can be improved. To accommodate the small logical margin problem, high performance sense amplifiers are used for sensing the bit line potential difference.

Thus, conventionally the solution of this problem depends only on the sense amplifier. This causes many problems. A first problem is the complicated circuit of the sense amplifier. To fabricate such a complicated circuit into semiconductor chip, a large chip area is required, resulting in increase of cost to manufacture. A second problem is the reduced margin for the power voltage in the read mode. This is problematic particularly for the low voltage operation. A third problem is the need for the constant voltage source of 2V to be supplied to the bit line. The prior memory device must contain a circuit for forming such an intermediate voltage, resulting in increase of power consumption.

As described above, the prior nonvolatile memory device involves many problems; the increased chip area, unstable low voltage operation, and increased power consumption.

SUMMARY OF THE INVENTION

Accordingly, an object of this invention is to provide a nonvolatile memory device including the features of low voltage, low power consumption, high operating speed, and simple peripheral circuitry including the sense amplifier.

According to the present invention, there is provided a nonvolatile semiconductor memory device comprising a memory cell including a first conductivity type semiconductor substrate, first and second diffusion layers of a second conductivity type formed in said substrate, a channel region formed in the surface region of said substrate, which is located between said first and second diffusion layers, a floating gate electrode provided on said channel region, a control gate electrode provided on said floating gate electrode, and means for lessening an electric field concentration occurred between said first layer and said channel region, a control gate line for supplying predetermined voltages to said control gate electrode in a read mode and a write mode, a read line for supplying predetermined voltages to said first diffusion layer in the read and write modes, and a write line for supplying predetermined voltages to said second diffusion layer in the read and write modes.

According to the present invention, there is further provided a nonvolatile semiconductor memory device comprising a memory cell including a first conductivity type semiconductor substrate, first and second diffusion layers of a second conductivity type formed in said substrate, a channel region formed in the surface region of said substrate and located between said first and second diffusion layers, a floating gate electrode provided on said channel region, a control gate electrode provided on said floating gate electrode, and means for preventing the carriers generated in the vicinity of said first diffusion layer in said channel region from being injected into said floating gate electrode, a control gate line for supplying predetermined voltages to said control gate electrode in a read mode and a write mode, a read line for supplying predetermined voltages to said first diffusion layer in the read and write modes, and a write line for supplying predetermined voltages to said second diffusion layer in the read and write modes.

With such arrangements, the voltage is applied to the memory cell in such a manner that the current flowing between the first and second diffusion layers as the source and drain has the direction, which is reversed when the mode is changed from the read mode to the write mode and vice versa. To block the carrier injection into the floating gate electrode, means for lessening the electric field concentration is provided in the first diffusion layer in which the electric field is concentrated in the read mode. Alternatively, another means is provided for blocking the injection of carriers generated near the first diffusion layer into the floating gate.

BRIEF DESCRIPTION OF THE DRAWINGS

FIG. 1 shows a cross-sectional view of a conventional nonvolatile semiconductor memory cell of double gate type;

FIG. 2 shows a circuit diagram equivalent to the semiconductor memory cell shown in FIG. 1;

FIG. 3 shows values of voltages applied to the memory cell of FIG. 2, in the write, erase and read modes;

FIG. 4 shows a schematic cross-sectional view of a memory cell used for a nonvolatile semiconductor memory of the present invention;

FIG. 5 shows a circuit diagram equivalent to the semiconductor memory cell shown in FIG. 4;

FIG. 6 shows values of voltages applied to the memory cell of FIG. 5, in the write, erase and read modes;

FIGS. 7 to 10 show cross sectional views of specific structures of the memory cell shown in FIG. 4, respectively;

FIGS. 12 to 14 show circuit diagrams of read/write circuits used for the cell array shown in FIG. 11, respectively;

FIG. 16 shows a circuit diagram of another read/write circuit used for the cell array shown in FIG. 11;

FIG. 17 shows signal charts at various portions of the read/write circuit shown in FIG. 16; and FIG. 18 shows a circuit diagram modified from the read/write circuit shown in FIG. 12, in which some of the parts are shown in block or symbol form.

DETAILED DESCRIPTION OF THE PREFERRED EMBODIMENTS

Figure 10:
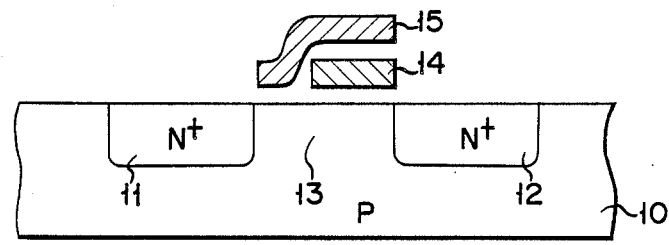

A semiconductor memory cell, which is used for a nonvolatile semiconductor memory device according to this invention, is illustrated in cross-sectional form in FIG. 4. As shown, source region 11 and drain region 12, as N type diffusion layers, are separately formed in the surface region of P type semiconductor substrate 10. Channel region 13 is located between diffusion layers 11 and 12. A first gate insulating film (not shown) is formed on channel region 13. Floating gate electrode 14 made of polycrystalline silicon, for example, is further formed on the first gate insulating film. A second gate insulating film (not shown) is formed on floating gate electrode 14. Control gate electrode 15, which is made of polycrystalline silicon, is laid on the second gate insulating film.

It is noted that in the memory cell, a means for lessening the electric field concentration between diffusion layer 11 and channel region 13 is provided in at least the portion of diffusion layer 11 which is in contact with channel region 13. Alternatively, the same portion is provided with a means for blocking the flow of hot electrons generated in the portion of channel region 13, near diffusion layer 11, to floating gate electrode 14. This means is denoted as 16 in FIG. 4.

A circuit diagram of a nonvolatile memory device using the memory cell thus structured is, partially illustrated in FIG. 5. In the circuit, transistor 20 serves as a memory cell of the memory device, and has a structure as shown in FIG. 4. The diffusion layer 11 of transistor 20 is coupled with read line RL, and the diffusion layer 12 is connected to write line WL. The control electrode 15 of transistor 20 is connected to control gate line CG.

The memory cell thus arranged operates in three modes, write, erase, and read modes, as in the prior art. These operation modes, and voltages at the read line RL write line WL and control gate line CG, are tabulated in FIG. 6.

The write mode (electron injection mode) will first be described. In this mode, electrons are injected into floating gate electrode 14 to raise the threshold voltage of cell transistor 20. The voltages at the respective portions in this mode are: WL=12.5, CG=12.5, and RL=0V. In operation, the high voltage of 12.5 V is applied between the diffusion layers 11 and 12 of the cell 20, and electrons move from diffusion layer 11 to diffusion layer 12. As in the prior art device, an intensive electric field is concentrated in the depletion layer, which is formed in the vicinity of the diffusion layer 12 in the channel region. The electrons toward the drain region D are accelerated by the concentrated electric field, and gain enough energy to jump over the energy barrier of the first gate insulating film (not shown), from the surface of substrate 10. The hot electrons are attracted by the high voltage applied to the control gate electrode 15, pass through the first gate insulating film, enter floating gate electrode 14, and are trapped there. As a result, the threshold voltage of cell transistor 20 rises.

In the data erase mode, the memory cells are radiated with ultraviolet rays. The radiated ultraviolet rays excite the electrons, which are injected into floating gate electrode 14 in the data write mode. The excited electrons jump over the energy barrier of the second insulating film (not shown) and enter control gate electrode 15. The electrons also jump over the energy barrier of the first insulating film (not shown) to enter into substrate 10. Such flow of electrons reduces the threshold value of cell transistor 20.

In the data read mode, the respective voltages are: WL=0V, CG=5V, and RL=5V. In this mode, when electrons have been injected into floating gate 14, the threshold voltage of the cell transistor is large. Under this condition, no channel is formed between the source and drain regions, thereby prohibiting the cell current flow. The read line voltage is kept at 5V. When the electrons are being emitted from the electrode, the threshold voltage of cell transistor 20 is small. Therefore, the cell current flows between read line RL and write line WL. The voltage on read line RL drops to approximately 0V. The voltage difference between 5V and 0V on read line RL is amplified by a sense amplifier (not shown) connected to this read line. This provides logical "1" or "0" of the data as read out from cell transistor 20.

It is noted that in the read mode, the normal read power voltage of 5V is directly applied to read line RL. Even though the 5V is applied to the read line, the soft write phenomenon can be prevented and the read retention characteristic can be significantly improved. This advantageous feature is due to the means 16 to lessen the electric field concentration or the hot electron blocking means 16 as already mentioned. With the provision of such means, the generation of hot electrons is constrained in the vicinity of the diffusion layer 11 in contact with channel region 13 or the hot electrons, if generated, can be prevented from being injected into floating gate electrode 14. Therefore, if the memory cell is subjected to the read mode for a long time, the injection of electrons into floating gate electrode 14 is minimized, providing a significant improvement of the read retention characteristic.

The cell transistor with the means 16 can practically be realized as shown in FIGS. 7 to 10. The devices of FIGS. 7 and 8 use the means for lessening the electric field concentration in the vicinity of the diffusion layer 11 in the channel region 13. In particular, in the case of the FIG. 7 cell transistor, N-type diffusion layer 17 is formed in the surface region of substrate 10, with one side of the layer 17 in contact with diffusion layer 11, and the other side in contact with channel region 13. The impurity concentration of diffusion layer 17 serving as means 16 is lower than that of diffusion layer 11. In the case of the FIG. 8 cell transistor, N-type diffusion layer 18 serving as the means 16 is provided surrounding the diffusion layer 11 in the surface region of substrate 10 as shown. The impurity concentration of diffusion layer 18 serving as means 16 is lower than that of diffusion layer 11.

In the cell transistors of FIGS. 9 and 10, the means 16 functions to prevent the hot electrons from being injected into floating gate electrode 14. In the case of the FIG. 9 transistor, insulating film 19 is formed on the portions of the surfaces of substrate 10 and diffusion layer 11, where diffusion layer 11 contacts channel region 13. One side of the film 19 is in contact with the surface portions, while the other side of the film 19 partially contacts the lower side (as viewed in the drawing) of floating gate electrode 14. The thickness of the film 19 is thicker than that of the remaining portion. This insulating film 19 may be replaced by an insulating film considerably impeding electrons as carriers passing therethrough. In the cell transistor of FIG. 10, floating electrode 14, which is located above the channel region 13, terminates in the mid-portion of channel region 13. In other words, it is laid only over a part of the channel region surface, not the entire channel region surface. Control gate 15 is laid in part above floating gate electrode 14, and bends downwardly (as viewed in the drawing) to extend over the channel region surface above which the gate 14 is not laid. This extended portion of control gate electrode 15 is used as the means 16.

If any of the cell transistors as shown in FIGS. 7 to 10 is applied to the memory cell and the voltages as shown in FIG. 6 are applied to the respective portions in the FIG. 5 circuit, the electric field can be concentrated in the vicinity of diffusion layer 12 in channel region 13, in the write mode. A sufficient number of electrons can be injected into floating gate electrode 14. In the data read mode, the electric field concentration near the diffusion layer 11 in channel region 13 is lessened to limit the generation of electrons to be injected into floating gate electrode 14, or to block the injection of electrons into floating gate electrode 14. As a result, the read retention characteristic is improved.

Figure 11:
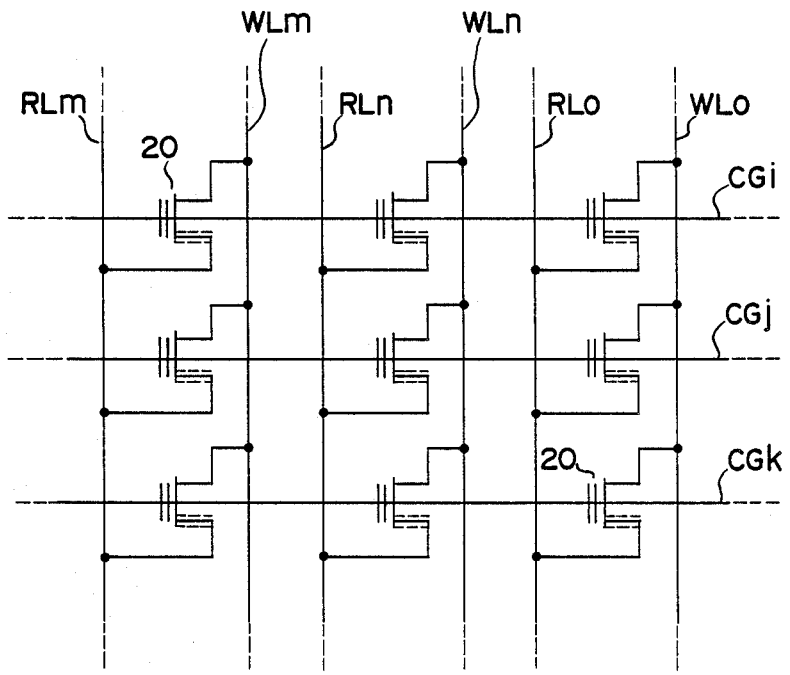
FIG. 11 shows a circuit diagram of a cell array of a nonvolatile semiconductor memory of the present invention, formed by the plural memory cells shown in FIG. 4.

Turning now to FIG. 11, there is shown a cell array of an EPROM made up of cell transistors of the type, which belongs to any of the FIGS. 7 to 10 transistor types. As shown, these cell transistors are arranged in a matrix fashion. A plurality of parallel arrayed read lines RLm, RLn and RLo are provided extending in column direction. Write lines WLm, WLn, and WLo are also arrayed in parallel and extend in the column direction. These read and write lines are alternately arranged. A plurality of control gate lines CGi, CGj and CGk are parallel arrayed and extend in the row direction. One read line RLm, for example, is connected to the sources of cell transistors linearly arrayed along that read line. The write line WLm adjacent to the read line RLm is connected to the drains of cell transistors 20 on the same column. The same thing is true for the remaining read and write lines, and cell transistors. One control gate line CGi, for example, is connected to the control gates of cell transistors linearly arrayed in the row of the matrix array and along that control gate line CGi. The remaining control gate lines CGj and CGk are connected to the cell transistors in a similarly fashion.

FIG. 12 shows a circuit diagram of a read/write circuit for the memory cell array of FIG. 11. In the circuit, memory cell array 20 is one of the matrix arrayed cell transistors as shown in FIG. 11. A switching transistor 31 as a P channel MOS transistor and load resistor 30 are connected in series between read line RL and power source Vcc. Another switching transistor 32 as an N channel MOS transistor is connected between read line RL and ground GND. A write control signal is connected to the gates of these switching transistors 31 and 32. The write control signal is 5V in the write mode, and 0V in the read mode. Read line RL is connected to the input terminal of sense amplifier 33.

In the write mode, the write control signal is set at 5V. P channel MOS transistor 31 is nonconductive, and N channel MOS transistor 32 is conductive. Finally, read line RL is connected to ground GND via transistor 32 and set at 0V. Write line WL and control gate line CG are set at 12.5V. Under this condition, electrons are injected into the floating gate electrode of cell transistor 20 in the manner as previously mentioned referring to FIGS. 4 to 6.

In the data read mode, the write control signal is set at 0V, MOS transistor 31 is conductive while MOS transistor 32 is nonconductive. Finally, read line RL is set at 5V. The sum Rr of conduction resistance of transistor 31 and resistance of resistor 30 is given by $$\text{Roff} \gg \text{Rr} \gg \text{Ron} \quad (1)$$

where Roff indicates the resistance between the read and write lines RL and WL when electrons are being injected into the floating gate electrode of memory cell 20, and Ron indicates the resistance between those lines RL and WL when electrons are being emitted from the same gate electrode.

In the read/write circuit satisfying the relation (1), 5V or 0V appears on read line RL in accordance with whether or not electrons are injected into or emitted from the floating gate electrode of cell transistor 20. In other words, the RL voltage is fully swung between Vcc and 0V in the respective operating states of the cell transistor. Therefore, even if power voltage Vcc is reduced, a satisfactorily large operating margin can be attained for the low voltage operation. This feature eliminates the need for the circuit for generating the voltage of 2V, resulting in reduction of power dissipation.

Let us consider the voltage setting ranges of the FIG. 12 circuit in the read and write modes. The voltage setting ranges are: 0V to 12.5V (high voltage system) for WL, 5V to 12.5V (high and low voltage systems) for CG, and 0V to 5V (low voltage system) for RL. As seen, the signal line used for both high and low voltage systems is only CG. The remaining signal lines WL and RL are used for the high voltage system and the low voltage system, respectively. This fact implies that the peripheral circuit for processing these signals is very simple. In other words, the peripheral circuit can be separated into the high voltage system and the low voltage system, simplifying the circuit arrangement.

FIG. 13 shows another example of a read/write circuit for the FIG. 11 memory array. This read/write circuit differs with respect to the load circuit for the read line RL. The load circuit contains a single component, P channel MOS transistor 34, while the FIG. 12 circuit contains two components, P channel MOS transistor 31 and resistor 30. Accordingly, the resistance Rr in the relation (1) only comprises the conduction resistance of transistor 34. The channel dimension of transistor 34 is adjusted so as to satisfy the relation (1).

Figure 14:
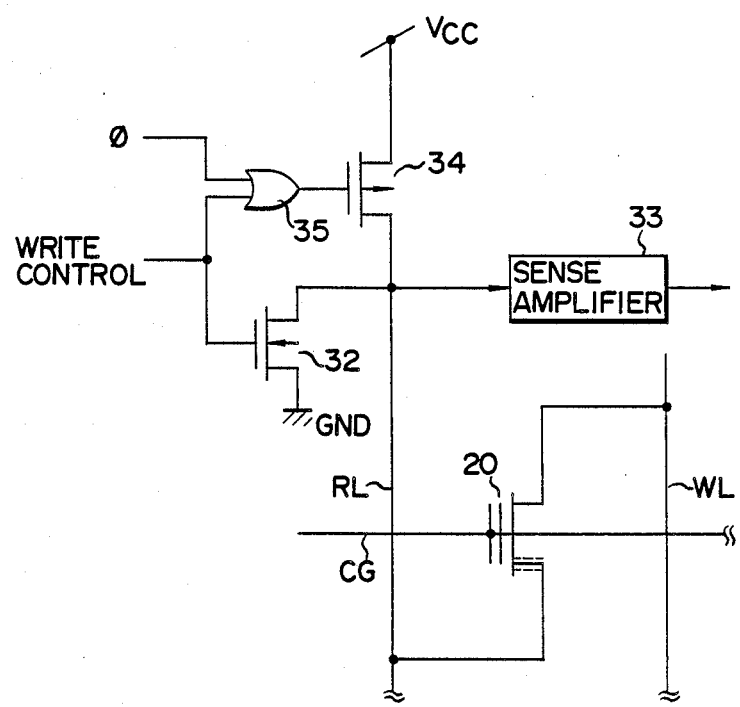

FIG. 14 shows another example of a read/write circuit for the FIG. 11 memory array. This example is a modification of the FIG. 13 circuit and includes OR gate 35 placed between the gate of load transistor 34 and the terminal for the write control signal. The OR gate 35 allows the write control signal to pass therethrough, while being timed by clock signal $\phi$.

Figure 15:
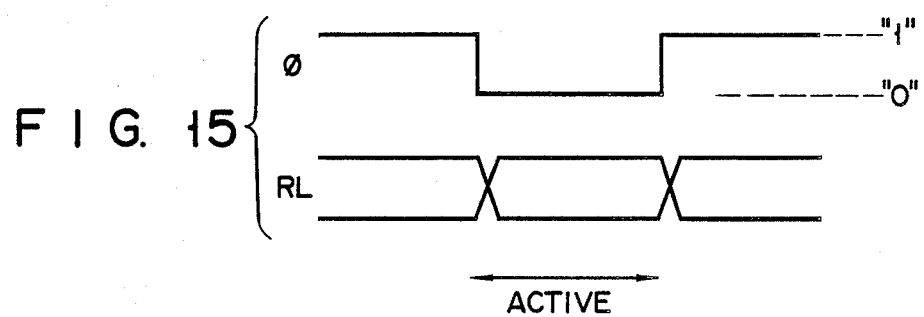
FIG. 15 shows signal charts at various portions of the read/write circuit shown in FIG. 14.

In this circuit, the write control signal is 0V in the read mode. Therefore, when clock signal $\phi$ is 0V, transistor 34 is conductive. The active period on read line RL (Vcc level duration) is only the period of $\phi=0V$, as shown in FIG. 15.

With such an arrangement, the read current flow can be limited to within the period of $\phi=0V$. The read current flows through write line WL in the read mode, which is derived from power source Vcc and applied to write line WL via read line RL and memory cell 20. This results in a further reduction of power consumption.

FIG. 16 shows a further example of the read/write circuit. The FIG. 16 circuit is a modification of the FIG. 14 circuit. In this circuit, AND gate 36 is inserted between the control gate line CG and the gate of cell transistor 20. AND gate 36 is controlled by the output of OR gate 35, so that the application of the control gate signal to cell transistor 20 is under control by clock signal $\phi$ through OR gate 35.

In operation, when $\phi=0V$, viz., during the precharge period, load transistor 34 is turned on to precharge read line RL to Vcc. At this time, the output of AND gate 36 is 0V, and the memory cell transistor 20 supplied with this voltage is nonconductive. Under this condition, no DC current flows from power source Vcc to write line via read line RL and cell 20.

When $\phi=5V$, the active period holds, and load transistor 34 is nonconductive. At this time, CG=5V and AND gate 36 outputs a 5V signal. Under this condition, when electrons are being injected into the control gate electrode, read line RL is kept at 5V. On the other hand, when electrons are being emitted from the electrode, it is at 0V.

In the read/write circuit of FIG. 16, no DC current flows from power source Vcc through read line RL and cell transistor 20 to write line WL. Therefore, a further power saving can be realized.

FIG. 18 shows a schematic illustration of a read/write circuit for the memory cell array. In this circuit, load 40 as illustrated in block form contains the switching transistor (31 or 34 in FIGS. 12 to 16) and/or load resistor (30 in FIG. 12). Inverter 33 is used in place of the sense amplifier (33 in FIGS. 12 to 16).

In the read/write circuit illustrated, the read line potential can be set to the extreme values, 0V and 5V, respectively in the read and write mode. Therefore, there is no need for the amplifying means, such as the sense amplifier, for amplifying the minute voltage difference. Hence, the sense amplifier, which is essential to the conventional circuit, may be replaced by a mere inverter designated as 33 in FIG. 18. This feature simplifies the circuit arrangement of the sense amplifier circuit, and reduces the access time.

As seen from the foregoing, the semiconductor memory device according to this invention is operable at high speed, and with low power dissipation, and with simple peripheral circuit including the sense amplifier circuit.

We claim:

1. A nonvolatile semiconductor memory device comprising:
a memory cell including a first conductivity type semiconductor substrate, first and second diffusion layers of a second conductivity type formed in said substrate, a channel region formed in the surface region of said substrate and located between said first and second diffusion layers, a floating gate electrode formed on said channel region, a control gate electrode formed on said floating gate electrode, and means for lessening an electric field concentration only between said first layer and said channel region;
a control gate line for supplying predetermined voltages to said control gate electrode, in a read mode and in a write mode;
a read line connected to said first diffusion layer, for reading out data from said memory cell; and
a write line connected to said second diffusion layer, for writing data into said memory cell.

2. The memory device according to claim 1, in which said write line supplies a first voltage to said second diffusion layer, in the write mode, and a second voltage, lower than said first voltage, to said second diffusion layer, in the read mode, said control gate line supplies said first voltage to said control gate electrode in the write mode, and a third voltage, lower than said first voltage but higher than said second voltage, to said control gate electrode, in the read mode, and said read line supplies said second voltage to said first diffusion layer, in the write mode, and said third voltage to the same, in the read mode.

3. The memory device according to claim 1, in which said means for lessening an electric field concentration includes a third diffusion layer of the second conductivity type, at a lower impurity concentration than that of said first diffusion layer, said third diffusion layer being formed between said first diffusion layer and said channel region.

4. The memory device according to claim 1, in which said means for lessening an electric field concentration includes a third diffusion layer of the second conductivity type, at a lower impurity concentration than that of said first diffusion layer, said fourth diffusion layer surrounding said first diffusion layer.

5. The memory device according to claim 2, further comprising a load circuit and a sense amplifier circuit, and in which said read line is connected to a power source via said load circuit, and a signal on said read line is supplied to said sense amplifier circuit.

6. The memory device according to claim 5, in which said load circuit includes a MOS transistor which is conductive only in the read mode.

7. The memory device according to claim 5, in which said load circuit includes a MOS transistor having a conduction which is controlled by a clock signal.

8. The memory device according to claim 5, in which said sense amplifier circuit includes an inverter circuit.

9. A nonvolatile semiconductor memory device comprising:
a memory cell including a first conductivity type semiconductor substrate, first and second diffusion layers of a second conductivity type formed in said substrate, a channel region formed in the surface region of said substrate and located between said first and second diffusion layers, a floating gate electrode formed on said channel region, a control gate electrode formed on said floating gate electrode, and carrier injection-preventing means for preventing the carriers generated in the vicinity of said first diffusion layer in said channel region from being injected into said floating gate electrode;
a control gate line for supplying predetermined voltages to said control gate electrode, in a read mode and in a write mode;
a read line connected to said first diffusion layer, for reading out data from said memory cell; and
a write line connected to said second diffusion layer, for writing data into said memory cell.

10. The memory device according to claim 9, in which said write line supplies a first voltage to said second diffusion layer, in the write mode, and a second voltage, lower than said first voltage, to said second diffusion layer, in the read mode, said control gate line supplies said first voltage to said control gate electrode, in the write mode, and a third voltage, lower than said first voltage but higher than said second voltage, to said control gate electrode, in the read mode, and said read line supplies said second voltage to said first diffusion layer, in the write mode, and said third voltage to the same, in the read mode.

11. The memory device according to claim 9, in which said carrier injection-preventing means is an insulating film formed between said floating gate and a portion of the substrate surface in which the junction of said first diffusion layer and said channel region is exposed, and prevents carriers from being injected into said floating gate electrode.

12. The memory device according to claim 9, in which said carrier injection-preventing means is a portion of said control gate and extends above the channel region surface lying between said first diffusion layer and said floating gate.

13. The memory device according to claim 10, further comprising a load circuit and a sense amplifier circuit, and in which said read line is connected to a power source via said load circuit, and a signal on said read line is supplied to said sense amplifier circuit.

14. The memory device according to claim 13, in which said load circuit includes a MOS transistor which is conductive only in the read mode.

15. The memory device according to claim 13, in which said load circuit includes a MOS transistor having a conduction which is controlled by a clock signal.

16. The memory device according to claim 13, in which said sense amplifier circuit includes an inverter circuit.

* * * * *